(12) United States Patent
Noquil et al.

(10) Patent No.: US 8,119,457 B2
(45) Date of Patent: Feb. 21, 2012

(54) FLIP CHIP MLP WITH FOLDED HEAT SINK

(75) Inventors: Jonathan A. Noquil, Surigao del Sur (PH); Yong Liu, Scarborough, ME (US); Jocel Gomez, Lapu-Lapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/882,353

(22) Filed: Sep. 15, 2010

(65) Prior Publication Data

US 2011/0003432 A1    Jan. 6, 2011

Related U.S. Application Data

(62) Division of application No. 11/625,100, filed on Jan. 19, 2007, now Pat. No. 7,812,437.

(60) Provisional application No. 60/802,182, filed on May 19, 2006.

(51) Int. Cl.
*H01L 21/82* (2006.01)
(52) U.S. Cl. ........................................ 438/123; 438/128
(58) Field of Classification Search .................. 257/675; 438/123
See application file for complete search history.

(56) References Cited

U.S. PATENT DOCUMENTS

| | | | |
|---|---|---|---|
| 4,554,575 A | 11/1985 | Lucas | |
| 4,960,236 A | 10/1990 | Hedges | |
| 5,062,896 A | 11/1991 | Huang | |
| 5,728,861 A | 3/1998 | Ostrem | |
| 6,040,626 A | 3/2000 | Cheah | |
| 6,507,120 B2 | 1/2003 | Lo et al. | |
| 6,777,800 B2 | 8/2004 | Madrid | |
| 6,867,072 B1 | 3/2005 | Shiu et al. | |
| 6,891,256 B2 | 5/2005 | Joshi et al. | |
| 7,408,251 B2 | 8/2008 | Hata et al. | |
| 7,541,681 B2 * | 6/2009 | Otremba | 257/781 |
| 7,663,212 B2 * | 2/2010 | Otremba | 257/678 |
| 2003/0001244 A1 | 1/2003 | Araki et al. | |
| 2003/0067071 A1 | 4/2003 | Cardwell | |
| 2004/0217474 A1 | 11/2004 | Kajiwara et al. | |
| 2004/0261980 A1 | 12/2004 | Dani et al. | |
| 2005/0104168 A1 * | 5/2005 | Choi et al. | 257/666 |
| 2005/0133896 A1 | 6/2005 | Liu et al. | |
| 2006/0001135 A1 | 1/2006 | Tanaka | |
| 2006/0055432 A1 * | 3/2006 | Shimokawa et al. | 327/5 |
| 2006/0186551 A1 | 8/2006 | Lange et al. | |
| 2007/0164409 A1 | 7/2007 | Holland | |
| 2007/0266558 A1 * | 11/2007 | Otremba | 29/840 |

FOREIGN PATENT DOCUMENTS

WO    WO2005059995 A2    6/2005

\* cited by examiner

*Primary Examiner* — Steven Loke
*Assistant Examiner* — Kimberly M Thomas
(74) *Attorney, Agent, or Firm* — Hiscock & Barclay, LLP

(57) ABSTRACT

A semiconductor package assembly including a molded leadless package (MLP) having an exposed top emitter pad and an exposed bottom source pad. A folded heat sink is attached to the exposed top emitter pad of the MLP by a soft solder attach process. The folded heat sink has a planar member generally coextensive in size with the MLP and in electrical and thermal contact with the top emitter pad of the MLP, and also has one or more leads extending generally perpendicularly to the planar member in a direction towards the lower surface of the MLP. These heat sink leads may provide the emitter connection to a printed circuit (PC) board.

14 Claims, 7 Drawing Sheets

FLIP CHIP MLP WITH FOLDED HEAT SINK

CROSS-REFERENCE TO RELATED APPLICATIONS

This application claims priority from U.S. patent application Ser. No. 11/625,100, filed on Jan. 19, 2007 which claimed the benefit of U.S. Provisional Patent Application Ser. No. 60/802,182, filed on May 19, 2006, which applications are hereby incorporated by reference. Reference is also made to a related application entitled "Dual Side Cooling Integrated Transistor Module and Methods of Manufacture," Ser. No. 11/740,175, filed Apr. 26, 2007.

FIELD OF THE INVENTION

This invention relates in general to semiconductor die packages and methods of making such packages and more particularly to a flip chip molded leadless package (MLP) with a folded heat sink and methods for making and using such a flip chip MLP.

BACKGROUND OF THE INVENTION

Power module packages typically use wire bonding which is a source of high resistance and noise. As the number of connections using wire bonding has increased significantly, problems of increased resistance, signal delays and signal interference has limited the further efficiency and density of future power modules. MLP and flip chip technologies have resulted in improved packaging designs. U.S. Pat. No. 6,507,120 B2, issued Jan. 14, 2003, inventors Lo et al., and U.S. Pat. No. 6,867,072 B1, issued Mar. 15, 2005, inventors Shiu et al., disclose flip chip and molding techniques which are improvements over traditional wire bonding techniques. U.S. Pat. No. 6,891,256 B2, issued May 10, 2005, inventors Joshi et al., discloses a thin, thermally enhanced flip chip in a leaded molded package which has been suitable for the applications for which it was intended. The package disclosed, however, has certain drawbacks, viz., the leaded molded package occupies more space than a molded leadless package, the heat sink is designed only for a leaded package and not a leadless package, and the method of heat sink attachment is not defined clearly (only that a clip is coupled to the exposed drain, and that paste dispense or printing may be used for such clip attachment).

With a current MLP package design utilizing a wire bond technique, performance, when a power device is housed, will be noncompetitive in terms of electrical and thermal characteristics. The generation of an MLP with clip bonding on the source and wirebond on the gate is costly and tedious and requires a longer processing flow (die attach, clip attach, and wirebond).

There is thus a need for a flip chip power device MLP type of package that is competitive in terms of electrical and thermal characteristics, that uses a simpler, less costly and tedious process to produce the package, and that efficiently addresses cooling problems.

SUMMARY OF THE INVENTION

According to the present invention there is provided a solution to these problems and fulfillment of these needs.

According to an aspect of the present invention there is provided
a semiconductor package assembly comprising:
a molded leadless package (MLP) having an exposed upper surface and a lower surface; and
a folded heat sink attached to said exposed upper surface of said MLP, said folded heat sink including a planar member generally coextensive in size with said MLP and in contact with said upper surface of said MLP and including one or more leads extending generally perpendicularly to said planar member in a direction towards said lower surface.

According to another feature of the present invention there is provided
a semiconductor package assembly comprising:
a molded leadless package (MLP) having an exposed upper surface and a lower surface; and
a folded heat sink attached to said exposed upper surface of said MLP, said folded heat sink including a planar member generally coextensive in size with said MLP and in contact with said upper surface of said MLP and including one or more leads extending generally perpendicularly to said planar member in a direction towards said lower surface; wherein said MLP includes a power flip chip MOSFET having a drain at said exposed upper surface, wherein said heat sink is attached to said drain, and wherein said one or more leads of said heat sink function as drain leads.

According to a further feature of the present invention there is provided
a method of making a semiconductor package assembly comprising:
providing on a tape a half etched lead frame having a die attach pad, a gate lead, one or more source leads, and one or more no connection leads;
flip chip attaching a power MOSFET to said die attach pad of said lead frame;
molding said lead frame and attached power MOSFET flip chip on said tape, such that the drain of said power MOSFET is exposed;
producing a molded leadless package (MLP) by sawing said molded lead frame and power MOSFET on said tape;
providing a heat sink having a planar member and one or more leads extending generally perpendicularly from said planar member; and
picking up a sawn MLP from said tape and soft solder attaching said MLP to said folded heat sink such the heat sink is in contact with said exposed drain and said heat sink leads end in the vicinity of said no connection leads.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1A:
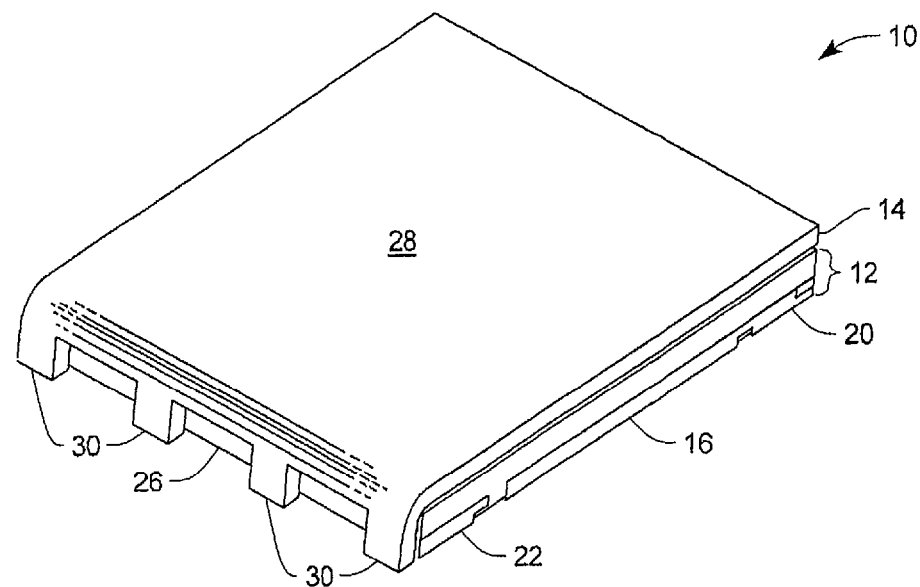
FIGS. 1A and 1B are respective top side and bottom side perspective views of an embodiment of a flip chip MLP with a folded heat sink according to the present invention.

It will be appreciated that for purposes of clarity and where deemed appropriate, reference numeral have been repeated in the figures to indicate corresponding features. Also, the relative size of various objects in the drawings has in some cases been distorted to more clearly show the invention.

DESCRIPTION OF THE INVENTION

Figure 1B:
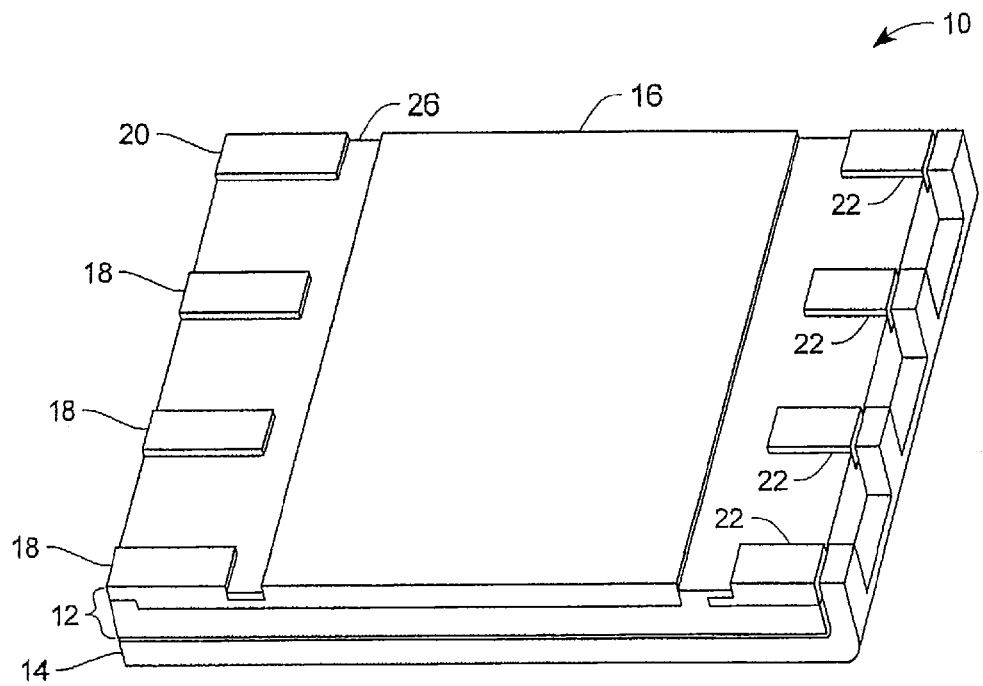

FIGS. 1A and 1B show an embodiment of a flip chip MLP with a folded heat sink 10 according to the present invention. As shown, a flip chip power MLP device 12 is attached to a folded heat sink 14. The device 12 may include a power semiconductor device and a lead frame encapsulated in molding material. The device 12 has a source pad 16, three source lands or leads 18, a gate lead 20, and four leads 22 with no connections on the bottom side of the device 12. A drain region 24 (shown in FIGS. 5A-C) is exposed on the top side of device 12. Molding material 26 is formed around the source pad 16, the source leads 18, the gate lead 20, the no connection leads 22, and the drain region 24. The folded heat sink 14 includes a planar member 28, generally coextensive in area with the top of the device 12, and folded leads 30 extending generally perpendicular to member 28 and along the side of device 12 with the no connection leads 22. The folded heat sink 14 can be of any electrically and thermally conductive material such as copper, aluminum, conductive polymer, or the like. The folded heat sink 14 is electrically and thermally attached to the drain region 24, and the folded leads 30 provide an emitter connection to the printed circuit (PC) board on which the flip chip is mounted.

As can be appreciated by viewing FIG. 1B, the flip chip MLP with a folded heat sink 10 may have a foot print of a SO-8 package. This is possible because the lengths of the source and gate lands 18, 20 are equal to the width of the no connection lands 22 plus the width of the folded leads 30 plus the gap between the no connection lands 22 and the folded leads 30.

Figure 2:
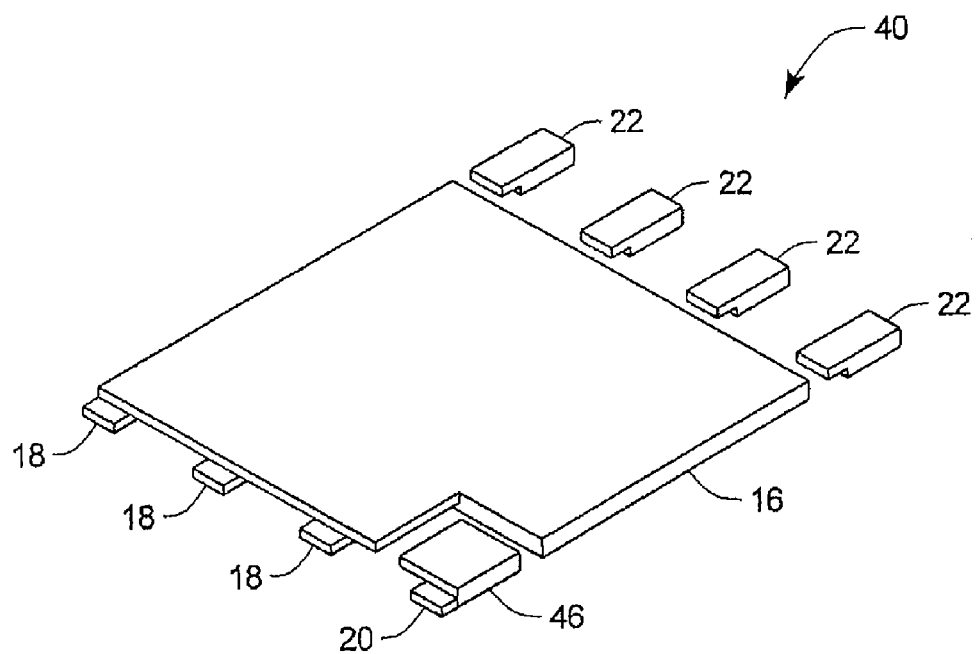
FIG. 2 is a top perspective view of a lead frame used to form the flip chip MLP with a folded heat sink shown in FIGS. 1A and 1B.

FIG. 2 is a top conceptual perspective view of a half etched lead frame 40 used in forming the flip chip MLP with a folded heat sink 10 without showing the tie bars used to hold the individual elements of the lead frame 40 in place during the subsequent processing through the molding operation. The lead frame 40 is one of an array of lead frames with the tie bars joining the lead frames 40 within the array. The source pad 16 is attached to the source leads 18, and a gate pad 46 is attached to the gate lead 20.

Figure 3A:
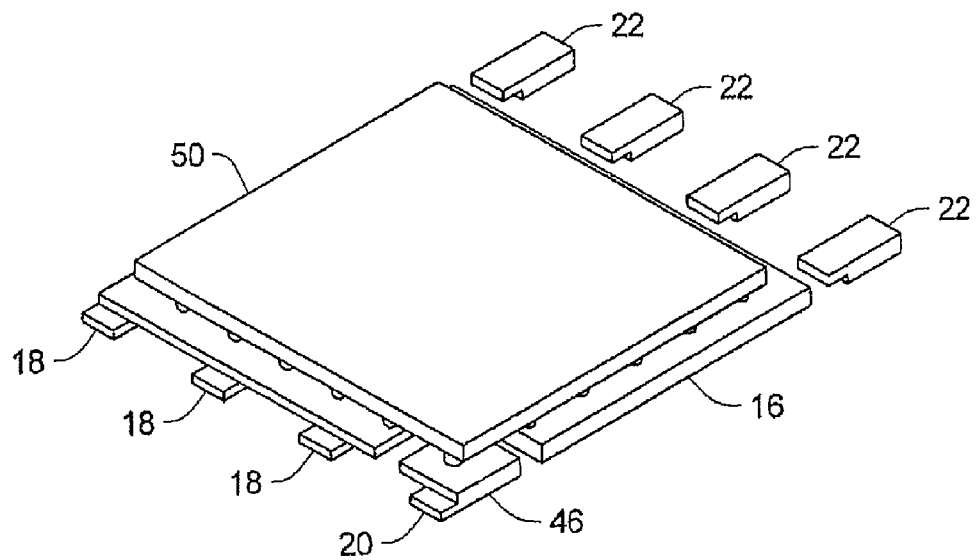
FIG. 3A is a top perspective view of the lead frame of FIG. 2 with a semiconductor chip of a first size mounted on the lead frame.
Figure 3B:
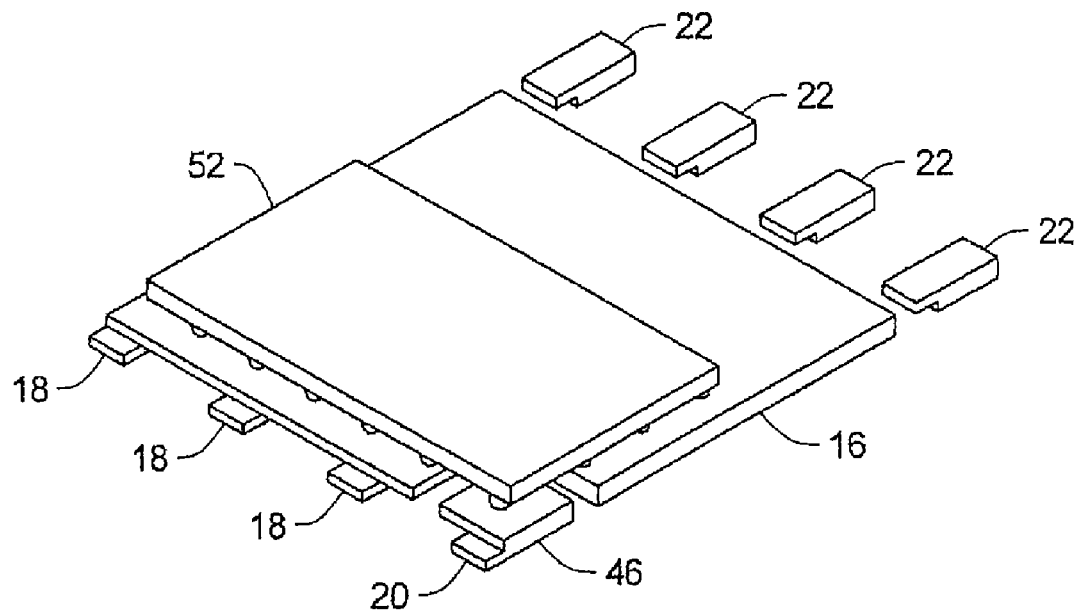
FIG. 3B is a top perspective view of the lead frame of FIG. 2 with a semiconductor chip of a second size mounted on the lead frame.
Figure 3C:
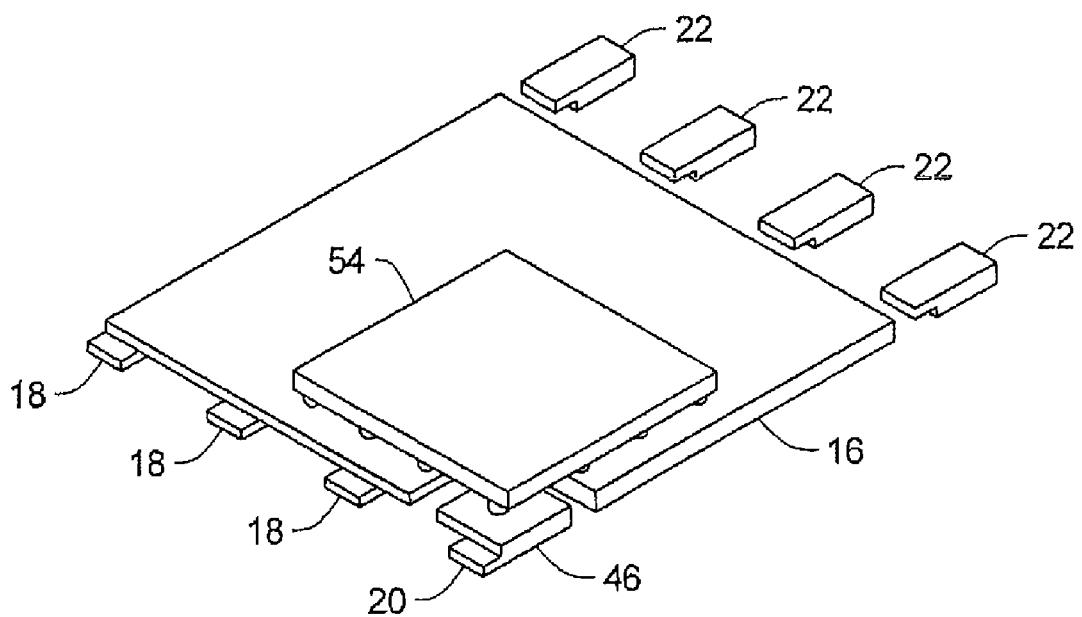
FIG. 3C is a top perspective view of the lead frame of FIG. 2 with a semiconductor chip of a third size mounted on the lead frame.

FIGS. 3A, 3B, and 3C are top conceptual perspective views of the lead frame of FIG. 2 with three different sized semiconductor die, 50, 52, and 54, respectively, which may be power MOSFETs, attached to the source pad 16 and the gate pad 46. The semiconductor die 50, 52, and 54 may have solder ball contacts and may be attached to the lead frame 40 using solder paste and a solder reflow operation.

Figure 4:
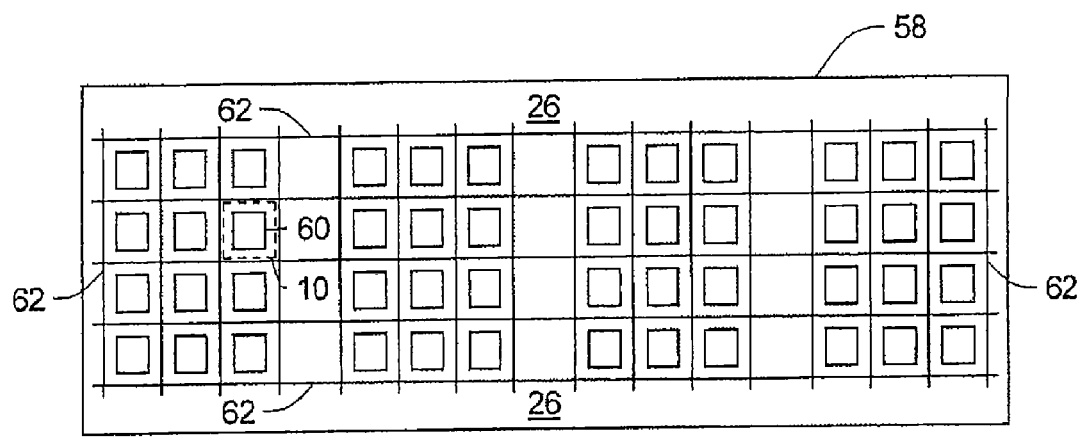
FIG. 4 is a top view of a molded array of the lead frames and semiconductor die shown in FIG. 3A.

FIG. 4 is a top view of an array 58 of the lead frames 40 after the molding operation with their attached semiconductor dies 50 shown in FIG. 3A. The back sides 60 of the semiconductor dies 50 are visible in FIG. 4. The lines 62 are indicative of the horizontal and vertical sawing used in the singulation of the individual flip chip MLP devices 12.

Figure 5A:
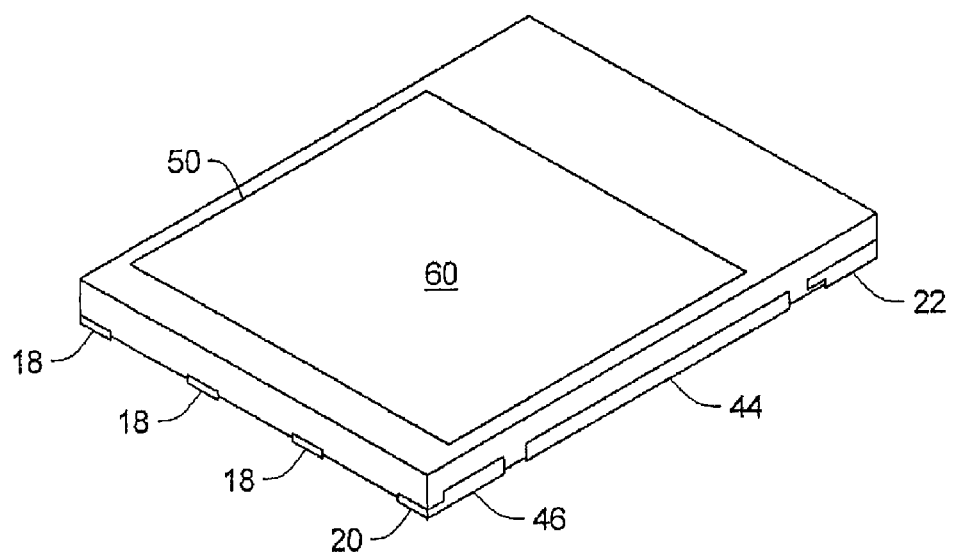
FIG. 5A is a top view of a flip chip MLP with the semiconductor die shown in FIG. 3A.
Figure 5B:
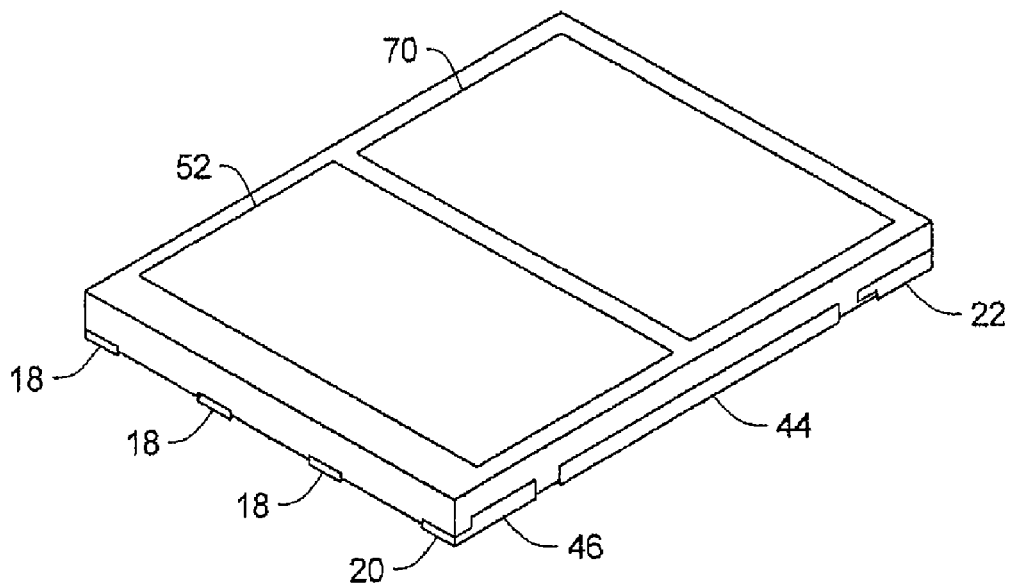
FIG. 5B is a top view of a flip chip MLP with the semiconductor die shown in FIG. 3B.
Figure 5C:
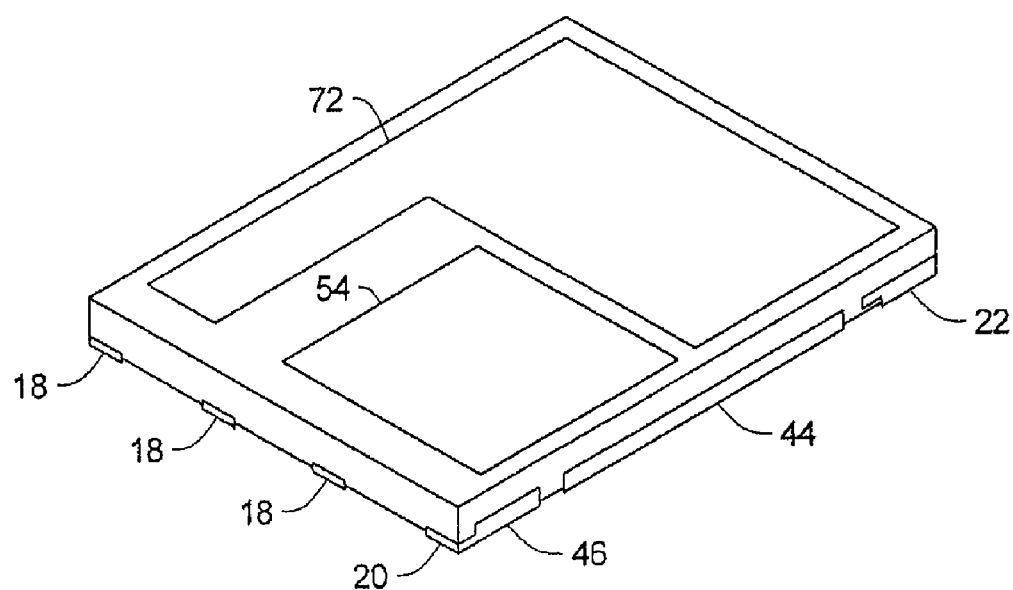
FIG. 5C is a top view of a flip chip MLP with the semiconductor die shown in FIG. 3C.

FIGS. 5A, 5B and 5C are top perspective views of the lead frames 40 after the molding operation with the semiconductor dies 50, 52, and 54, respectively, shown in FIGS. 3A, 3B, and 3C, respectively. In FIG. 5A the bottom 60 of the semiconductor die 50 fills an appreciable amount of the area of the top of the flip chip MLP device 12, and thereby provides a large area for attachment of the device 12 to the folded heat sink 14. However, the semiconductor die 52 and 54, shown in FIGS. 3B and 3C, respectively, provide a significantly decreased area for attachment to the folded heat sink 14. Areas of a printable solderable material 70 and 72 have been applied to the top of the mold material in FIGS. 5A and 5B, respectively, to enhance the bond between the MLP devices 12 to the folded heat sink 14.

Figure 6:
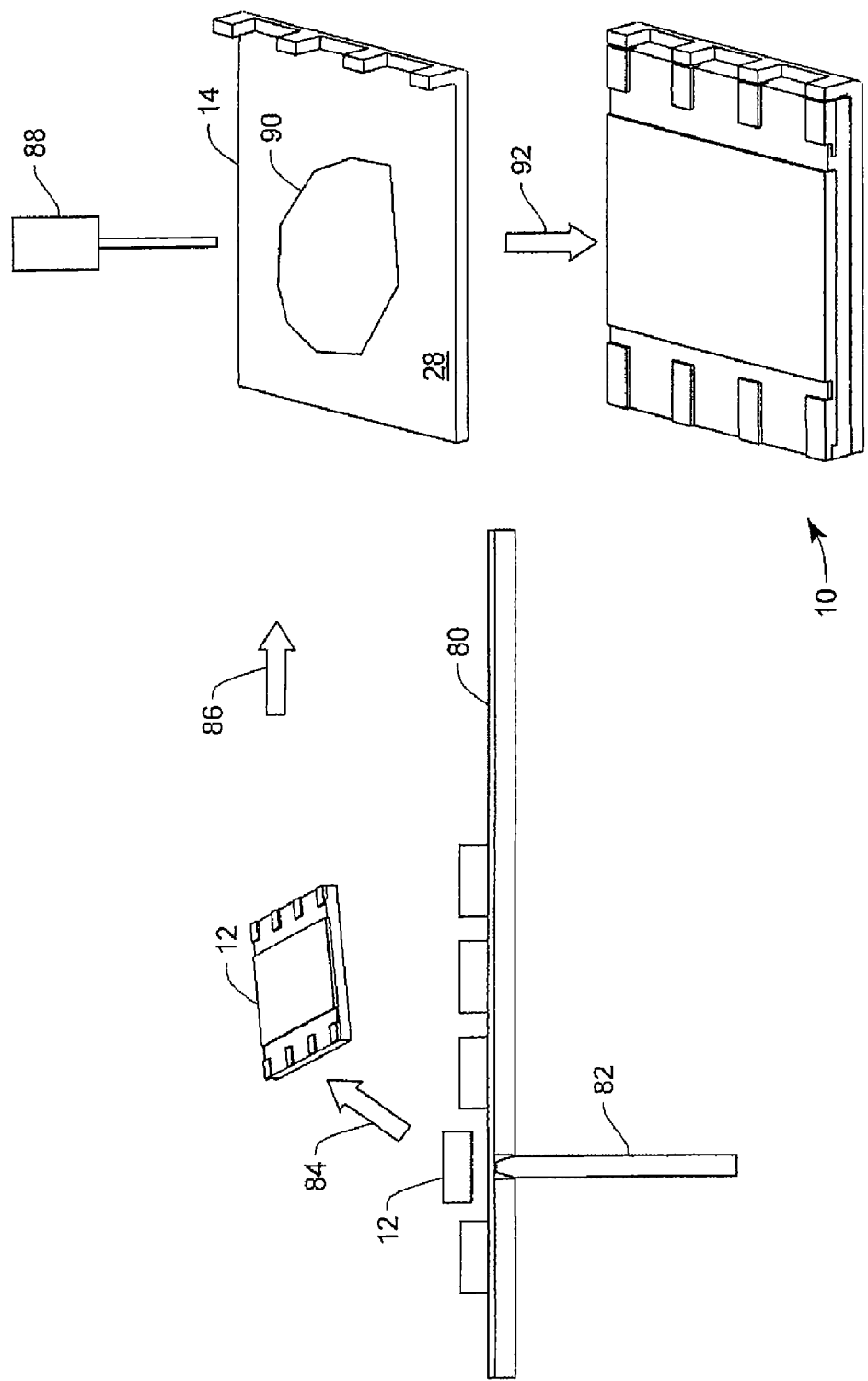
FIG. 6 is a diagram of the steps used in one embodiment of the present invention to attach the flip chip MLP to folded heat sink.

FIG. 6 is a diagram of the steps used in one embodiment of the present invention to attach the flip chip MLP device 12 to the folded heat sink 14. As shown in FIG. 6, flip chip MLP devices 12 move on a conveyer belt 80. A pick rod 82 displaces the flip chip MLP devices 12 as indicated by the arrow 84 which have passed electrical test into a handling device (not shown). At the same time a soft solder dispenser 86 pushes soft solder onto the bottom of the planar member 28 of the folded heat sink 14 after it has been heated enough to melt the soft solder wire from the dispenser 88. After the appropriate amount of soft solder 90 has been melted onto the folded heat sink 14, the flip chip MLP device 12 is aligned with the folded heat sink 14 as indicated by the arrow 86 and the two pieces are pressed together to solder the flip chip MLP device 12 and the folded heat sink 14 to form the flip chip MLP with a folded heat sink 10 as indicated by the arrow 92. Compared to solder cream, the use of soft solder provides an easy soldering process where the wire is melted and attached on the same machine. Good alignment is achieved since alignment is controlled during pick-up with 2 mil placement accuracy possible, and there is minimal voiding of the solder. In the solder cream process, however, the paste needs to be printed with a printer and stencil, a reflow machine is needed, alignment is affected during the reflow process with a tendency to rotate the die, and voiding is difficult to control during reflow, since flux content is trapped during reflow. The soft solder attach process avoids these problems of the solder cream attach process.

Figure 7:
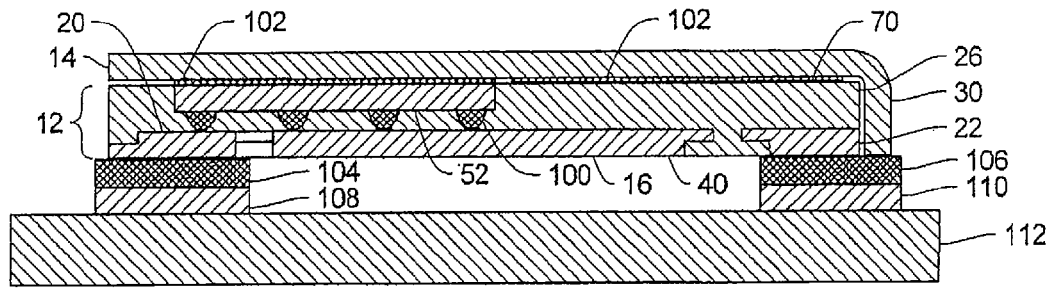
FIG. 7 is a side cross sectional view of the flip chip MLP with a folded heat sink shown in FIGS. 1A and 1B mounted on solder paste on a conductive track on a printed circuit (PC) board.

FIG. 7 is a side cross sectional view of the flip chip MLP device with a folded heat sink 10 shown in FIGS. 1A and 1B mounted on first and second solder paste regions 104 and 106, which in turn have been laid down on first and second conductive tracks 108 and 110, respectively, on a PC board 112. As can be seen in FIG. 7, the no connection lands 22 and the bottoms of the folded leads 30 are planar and rest on the solder paste region 106.

Figure 8:
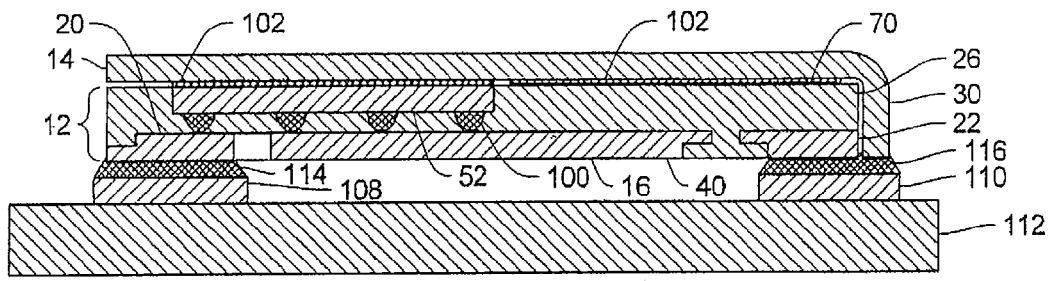
FIG. 8 is FIG. 7 after the solder paste has been reflowed.

FIG. 8 is FIG. 7 after the solder paste regions 104 and 106 have been reflowed. As can be seen in FIG. 8 the solder 110 from the solder paste region 106 forms an electrical and thermal connection between the no connection leads 22, the folded leads 30 and the conductive track 110. Although the width of the no connection lands 22 plus the width of the folded leads 30 is less than the width of the source and gate lands 18, 22 the whetting of the solder 116 up the sides of the no connection lands 22 and the folded leads 30 provides a solder connection with the conductive track 106 comparable to the solder connection of the source and gate lands 18, 20 to the conductive track 104. Moreover, the no connect leads 22, which are adjacent the folding leads 30 of the folded heat sink 14, prevent excess solder around the folded leads 30 during soldering of the flip chip MLP with a folded heat sink 10 to the PC board 112.

Figure 9:
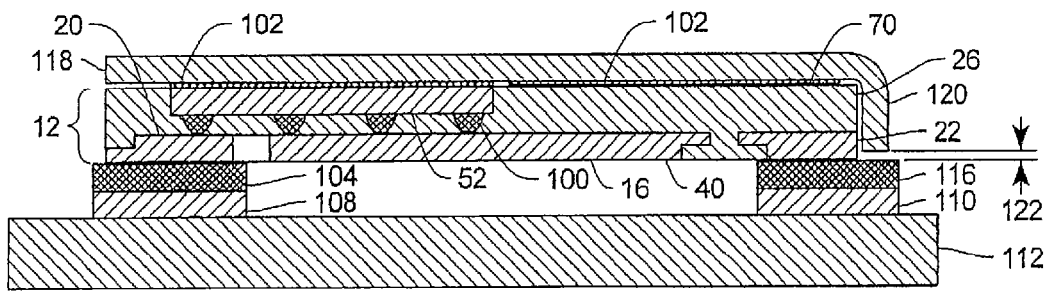
FIG. 9 is the same side cross sectional view of FIG. 7 except that the folded leads of the folded heat sink have been shortened.

FIG. 9 is the same side cross sectional view of FIG. 7 except that the folded leads 30 of the folded heat sink of FIGS. 7 and 8 have been shortened as indicated by the gap 122, which in one embodiment is about 30 microns, to provide a more reliable solder connection between the folded leads 120 of the folded heat sink 118 and the conductive track 110. Preferably, for use with this particular embodiment, the solder paste 116 is about 150 microns high prior to being reflowed.

Figure 10:
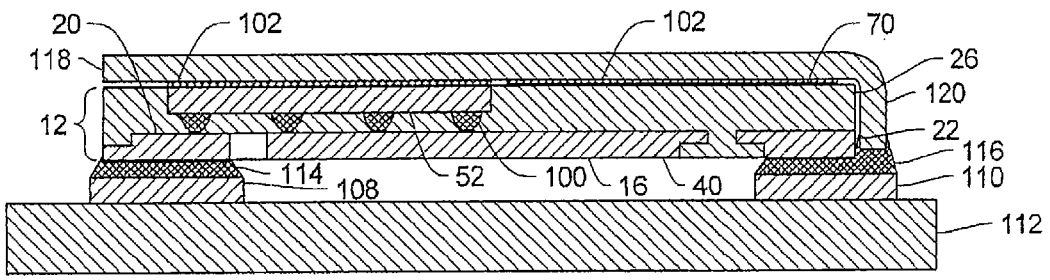
FIG. 10 is FIG. 9 after the solder paste has been reflowed.

FIG. 10 is FIG. 9 after the solder pastes 104 and 116 have been reflowed. Because of the gap between the ends of the folded leads 120 and the conductive track 110, the reflowed solder 116 can adhere fully to the bottoms of the folded leads 120.

The invention has been described in detail with particular reference to certain preferred embodiments thereof, but it will be understood that variations and modifications can be effected within the spirit and scope of the invention.

The invention claimed is:

1. A method of making a semiconductor package assembly comprising:
   providing, on a tape, a half-etched lead frame having a die attach pad, a gate lead, one or more source leads, and one or more no connection leads;
   flip chip attaching a power MOSFET to said die attach pad of said lead frame;
   molding said lead frame and attached power MOSFET flip chip on said tape, such that the drain of said power MOSFET is exposed;
   producing a molded leadless package (MLP) by sawing said molded lead frame and power MOSFET on said tape;
   providing a folded heat sink having an exposed planar top surface and one or more leads extending generally perpendicularly from said planar top surface; and
   picking up said sawn MLP from said tape and soft-solder-attaching said MLP to said folded heat sink such that the heat sink is in contact with said exposed drain and said folded heat sink leads end in the vicinity of said no connection leads and are separated from the no connection leads by an empty gap.

2. The method as recited in claim 1, wherein the sum of the lengths of one no connection lead, the length of one folded heat sink lead and the length of an empty gap between these two leads is equal to a first length and the source leads and the gate lead each have said first length.

3. The method as recited in claim 1, further comprising the step of mounting the assembly on a circuit board.

4. The method as recited in claim 3, further comprising the step of soldering the assembly to the circuit board with electrically conductive solder.

5. The method as recite in claim 1, further comprising the step of soldering the assembly to a circuit board with electrically conductive solder, the solder being positioned to bridge the empty gap and establish an electrical connection between the no connection leads of the MLP and the folded heat sink leads.

6. The method as recited in claim 4, further comprising the step of reflowing the solder.

7. The method as recited in claim 1, further comprising the steps of:
   soldering the assembly to a circuit board with electrically conductive solder; and
   reflowing the solder to bridge the empty gap and establish an electrical connection between the no connection leads of the MLP and the folded heat sink leads.

8. A method of making a semiconductor package assembly comprising:
   providing a half-etched lead frame having a die attach pad, a gate lead, one or more source leads, and one or more drain-connectable leads;
   flip chip attaching a power MOSFET to said die attach pad of said lead frame;
   molding said lead frame and attached power MOSFET, such that the drain of said power MOSFET is exposed;
   producing a molded leadless package (MLP) by sawing said molded lead frame;
   providing a folded heat sink having an exposed planar top surface and one or more leads extending generally perpendicularly from said planar top surface; and
   soft-solder-attaching said MLP to said folded heat sink such that the folded heat sink is in contact with said exposed drain of the MOSFET and said folded heat sink leads fold over one side of said MOSFET to end in the vicinity of said drain-connectable leads while still being electrically isolated therefrom by an empty gap.

9. A method of making a semiconductor package assembly comprising:
   providing a half-etched lead frame having a die attach pad, a gate lead, one or more source leads, and one or more drain-connectable leads;
   flip chip attaching a power MOSFET to said die attach pad of said lead frame;
   molding said lead frame and attached power MOSFET, such that the drain of said power MOSFET is exposed;
   producing a molded leadless package (MLP) by sawing said molded lead frame;
   providing a folded heat sink with a perimeter, the heat sink having both an exposed planar top surface and an exposed vertical edge forming one or more leads extending generally perpendicularly from said planar top surface; and
   soft-solder-attaching said MLP to said folded heat sink such that MLP is disposed entirely within the perimeter of the folded heat sink, the folded heat sink being in contact with said exposed drain of the MOSFET wherein said exposed vertical edge folds over one side of said MLP to end in the vicinity of said drain-connectable leads while still being electrically isolated therefrom by an empty gap.

10. The method as recited in claim 9, further comprising the step of mounting the assembly on a circuit board.

11. The method as recited in claim 10, further comprising the step of soldering the assembly to the circuit board with electrically conductive solder.

12. The method as recite in claim 11, the solder being positioned to bridge the empty gap and establish an electrical connection between the drain-connectable leads of the MLP and the folded heat sink leads.

13. The method as recited in claim 11, further comprising the step of reflowing the solder.

14. The method as recited in claim 11, further comprising the step of reflowing the solder to bridge the empty gap and establish an electrical connection between the drain-connectable leads of the MLP and the folded heat sink leads.

* * * * *